United States Patent
Sakamoto

(10) Patent No.: US 10,034,380 B2
(45) Date of Patent: Jul. 24, 2018

(54) ELECTRONIC DEVICE AND METHOD FOR MANUFACTURING ELECTRONIC DEVICE

(71) Applicant: Murata Manufacturing Co., Ltd., Nagaokakyo-shi, Kyoto-fu (JP)

(72) Inventor: Hiroki Sakamoto, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 15/610,843

(22) Filed: Jun. 1, 2017

(65) Prior Publication Data

US 2017/0359900 A1    Dec. 14, 2017

(30) Foreign Application Priority Data

Jun. 8, 2016  (JP) ................. 2016-114178

(51) Int. Cl.
| | |
|---|---|
| H05K 5/00 | (2006.01) |
| H05K 1/18 | (2006.01) |
| H01G 4/30 | (2006.01) |
| H05K 1/03 | (2006.01) |
| H05K 3/00 | (2006.01) |
| H05K 3/12 | (2006.01) |
| H05K 3/34 | (2006.01) |
| H05K 3/36 | (2006.01) |
| H05K 3/40 | (2006.01) |

(Continued)

(52) U.S. Cl.
CPC .............. *H05K 1/189* (2013.01); *H01G 4/30* (2013.01); *H05K 1/028* (2013.01); *H05K 1/0293* (2013.01); *H05K 1/0393* (2013.01); *H05K 1/115* (2013.01); *H05K 1/144* (2013.01); *H05K 1/181* (2013.01); *H05K 3/0052* (2013.01); *H05K 3/12* (2013.01); *H05K 3/3442* (2013.01); *H05K 3/3494* (2013.01); *H05K 3/363* (2013.01); *H05K 3/4038* (2013.01); *H05K 1/02* (2013.01); *H05K 1/0298* (2013.01); *H05K 1/11* (2013.01); *H05K 1/118* (2013.01); *H05K 1/147* (2013.01); *H05K 1/148* (2013.01); *H05K 3/4691* (2013.01); *H05K 2201/049* (2013.01); *H05K 2201/05* (2013.01); *H05K 2201/10015* (2013.01); *H05K 2201/20* (2013.01)

(58) Field of Classification Search
CPC .... H05K 1/02; H05K 1/0298; H05K 2201/20; H05K 2201/05; H05K 1/0393; H05K 1/11; H05K 1/118; H05K 1/147; H05K 1/148; H05K 3/4691
USPC ....... 361/748, 749, 760, 761, 763, 764, 770, 361/783, 789
See application file for complete search history.

(56) References Cited

FOREIGN PATENT DOCUMENTS

| JP | H08-18285 A | 1/1996 |
|---|---|---|
| JP | 2007-19311 A | 1/2007 |

(Continued)

*Primary Examiner* — Binh Tran
(74) *Attorney, Agent, or Firm* — Arent Fox LLP

(57) ABSTRACT

An intermediate connection layer interposed between a wiring substrate and an electronic part includes a rigid substrate and a flexible substrate. A plurality of conductor portions are formed on opposed principal surfaces of the respective flexible and rigid substrates. The rigid substrate is provided with an opening, and a fuse portion on the flexible substrate faces the opening. The flexible substrate and the rigid substrate are bonded together with solders. The respective rigid and flexible substrates are separately made, solder pastes are applied to the rigid substrate, both substrates are overlaid on each other, and the solder pastes are heated and solidified to make the intermediate connection layer.

20 Claims, 19 Drawing Sheets

(51) Int. Cl.
*H05K 7/00* (2006.01)
*H05K 1/14* (2006.01)
*H05K 1/11* (2006.01)
*H05K 1/02* (2006.01)
*H05K 3/46* (2006.01)

(56) References Cited

FOREIGN PATENT DOCUMENTS

JP          2015-177082 A     10/2015
WO     WO 2016/039260 A1    3/2016

ELECTRONIC DEVICE AND METHOD FOR MANUFACTURING ELECTRONIC DEVICE

CROSS REFERENCE TO RELATED APPLICATIONS

The present application claims priority to Japanese Patent Application No. 2016-114178, filed Jun. 8, 2016, the entire contents of which are incorporated herein by reference.

BACKGROUND OF THE INVENTION

Field of the Invention

The present invention relates to an electronic device and an electronic device manufacturing method, and, more specifically, the present invention relates to an electronic device in which electronic parts such as a chip multilayer ceramic capacitor are mounted and an electronic device manufacturing method.

Description of the Related Art

Conventionally, a surface mounting technique of mounting electronic parts such as a chip multilayer ceramic capacitor on a substrate is widely known. Further, according to surface mounting techniques of this type, electronic devices in which an intermediate connection layer having a fuse function is interposed between an electronic part and a wiring substrate to prevent a mounted substrate from burning out and firing even when a large current flows to the mounted electronic part have been actively studied and developed.

For example, International Publication No. 2016/039260 proposes an electronic device illustrated in FIG. 19.

This electronic device includes a wiring substrate 102 which includes land electrodes 101a and 101b, and an electronic part 103 which is mounted on the wiring substrate 102, and an intermediate connection layer 104 is interposed between the wiring substrate 102 and the electronic part 103. Further, the intermediate connection layer 104 includes a flexible portion 105 which is mainly made of a flexible material and a pair of rigid portions 106a and 106b which are mainly made of a rigid material, and the flexible portion 105 is sandwiched between the rigid portions 106a and 106b. That is, the intermediate connection layer 104 is composed of a rigid flexible substrate formed by integrally forming the flexible portion 105 and the rigid portions 106a and 106b.

Further, according to International Publication No. 2016/039260, the electronic part 103 and the intermediate connection layer 104, and the intermediate connection layer 104 and the wiring substrate 102 are connected with solders 107 and 108 interposed therebetween.

FIG. 20 is a sectional view of an X-X arrow view in FIG. 19.

As described above, the flexible portion 105 of the intermediate connection layer 104 is sandwiched between the rigid portions 106a and 106b. Further, a plurality of connection electrodes 109a to 109d electrically connected with the land electrodes 101a and 101b and the electronic part 103 are formed on principal surfaces of the rigid portions 106a and 106b, and an opening 110 is formed between the rigid portions 106a and 106b. Furthermore, a conductor portion 111 is formed on a facing surface of the flexible portion 105 facing the electronic part 103. This conductor portion 111 includes a fuse portion 112 formed in a narrow shape, and the fuse portion 112 is disposed inside the opening 110.

Further, the intermediate connection layer 104 includes a first conduction via 113 which penetrates the intermediate connection layer 104, a second conduction via 114 which conducts with the rigid portion 106a and the flexible portion 105, and a third conduction via 115 which conducts with the rigid portion 106b and the flexible portion 105. Thus, the connection electrode 109b and the connection electrode 109b are electrically connected, and the electronic part 103 and the wiring substrate 102 are electrically connected with the intermediate connection layer 104 interposed therebetween. In this regard, protection films 116 made of solder resists and the like are formed on appropriate portions of principal surfaces of the rigid portions 106a and 106b.

According to International Publication No. 2016/039260, the fuse portion 112 is formed on the flexible portion 105, and therefore, even when a large current of a rated current or more flows to the mounted electronic part 103 and the electronic part 103 is damaged, the fuse portion 112 is placed in an open state. Further, the fuse portion 112 is disposed inside the opening 110, so that it is possible to suppress heat diffusion from the flexible portion 105 to the rigid portions 106a and 106b, and easily fuse the fuse portion 112.

Furthermore, the fuse portion 112 is formed on the flexible portion 105, so that it is not necessary to attach the fuse via a solder interposed therebetween, and, consequently, it is possible to suppress variations of fusing characteristics without an influence of wettability of the solder.

SUMMARY OF THE INVENTION

According to International Publication No. 2016/039260, as described above, the intermediate connection layer 104 is composed of the rigid flexible substrate formed by integrally forming the flexible portion 105 and the rigid portions 106a and 106b, and the first to third conduction vias 113 to 115 are provided on the intermediate connection layer 104 to secure conductivity between the electronic part 103 and the wiring substrate 102.

However, hole diameters of the first to third conduction vias 113 to 115 are generally small, and therefore when the electronic part 103 is mounted, an equivalent series resistance (referred to as an "ESR" below) of the intermediate connection layer 104 becomes high. Further, an increase in the ESR increases a heat generation amount and causes deterioration of the electronic part and energy loss.

Furthermore, the rigid flexible substrate of the above integrated structure needs an adhering process to adhere the rigid portions 106a and 106b and the flexible portion 105, and therefore is expensive. Still further, when the intermediate connection layer 104 is formed by using this rigid flexible substrate, it is necessary to provide the first to third conduction vias 113 to 115 as described above and perform via processing and plating processing. That is, according to International Publication No. 2016/039260, there is a concern that the ESR increases, the manufacturing process is complicated and manufacturing cost steeply rises.

The present invention has been made in light of such a condition, and an object of the present invention is to provide a reliable electronic device in which an ESR is low and which has a fuse function with good fusing characteristics, and an electronic device manufacturing method which can efficiently manufacture this electronic device at low cost.

To achieve the above object, an electronic device according to the present invention includes a wiring substrate; an electronic part; and an intermediate connection layer interposed between the wiring substrate and the electronic part, the wiring substrate and the electronic part being electrically connected with each other. The intermediate connection layer includes a rigid substrate which is mainly made of a rigid material, and a flexible substrate which is mainly made of a flexible material, a plurality of conductor portions electrically insulated from each other are formed on both principal surfaces of the flexible substrate and the rigid substrate. The rigid substrate includes an opening formed between the conductor portions. One of the conductor portions on the flexible substrate and at a side facing the rigid substrate includes a fuse portion having a narrow shape and the fuse portion is positioned facing the opening. The flexible substrate and the rigid substrate are electrically connected with a conductive bonding agent interposed therebetween.

Furthermore, in a method for manufacturing an electronic device that includes a wiring substrate; an electronic part; and an intermediate connection layer interposed between the wiring substrate and the electronic part, the method includes a step of preparing a rigid mother board and a flexible mother board; a step of forming a plurality of conductor portions, which are electrically insulated from each other, on both principal surfaces of the flexible mother board, forming a fuse portion, and forming through-holes inside the conductor portions; a step of forming a plurality of conductor portions, which are electrically insulated from each other, on both principal surfaces of the rigid mother board, and forming an opening between the conductor portions; a step of applying a conductive bonding agent on the rigid substrate; and a step of disposing the flexible substrate and the rigid substrate such that the fuse portion faces the opening, filling the conductive bonding agent in the through-holes, and bonding the flexible substrate and the rigid substrate with the conductive bonding agent interposed therebetween.

By disposing the fuse portion at the side facing the rigid substrate at the opening, and electrically connecting the flexible substrate and the rigid substrate with the conductive bonding agent interposed therebetween, that it is possible to make current paths thick. Further, a current passes between the rigid substrate and the flexible substrate without passing above the flexible substrate, so that it is not necessary to provide conduction vias like those of International Publication No. 2016/039260. The current paths also become thick and short and it is possible to reduce an ESR.

Furthermore, the fuse portion faces the opening of the rigid substrate. The fuse portion does not directly contact the rigid substrate, and, even when such a current that the fuse portion is not instantaneously fused flows therethrough, it is possible to suppress heat transmission of heat generated from the fuse portion to surroundings, fuse the fuse portion in a short time and prevent the intermediate connection layer and the wiring substrate from firing, in advance.

Further, preferably, the electronic part is mounted on the flexible substrate, and the rigid substrate is electrically connected to the wiring substrate.

That is, because the fuse portion is disposed facing the opening of the rigid substrate, even after the electronic part is mounted on the flexible substrate, it is possible to visually check an adhered state where the conductive bonding agent is adhered to the fuse portion with the opening interposed therebetween, and easily perform external appearance inspection.

Further, preferably, the flexible substrate is provided with through-holes inside the conductor portions formed on the flexible substrate, and the conductive bonding agent is filled in the through-holes.

Consequently, it is possible to bond the flexible substrate and the rigid substrate with the conductive bonding agent interposed therebetween and easily fix the rigid substrate and the flexible substrate to predetermined positions without additionally requiring an adhesive for temporal adhesion.

Further, preferably, window portions are formed at both sides of the fuse portion on the flexible substrate.

When a large current flows to a circuit and the fuse portion generates heat, it is possible to suppress heat transmission to the surroundings and fuse the fuse portion in a shorter time.

Further, preferably, the conductor portion formed on the first principal surface and a conductor portion formed on a second principal surface of the rigid substrate are positioned orthogonally to each other.

Consequently, even when the intermediate connection layer is mounted on the wiring substrate and then the wiring substrate is warped by post-processing, it is possible to suppress a deformation amount of the intermediate connection layer and improve a warp strength of the electronic device.

Further, preferably, a pair of the conductor portions on the flexible substrate formed in opposing surfaces of the electronic part include a conductor portion interval A, and when the rigid substrate is bonded to the wiring substrate, and a bonding distance B in a side surface direction between the rigid substrate and the wiring substrate is shorter than the conductor portion interval A.

Even when heat loads are repeatedly applied, it is possible to alleviate local concentration of a stress caused by a difference between linear expansion coefficients of the rigid substrate and the electronic part, and prevent occurrence of a structural defect such as a crack at a bonding portion of the electronic part and the intermediate connection layer.

Further, preferably, the flexible substrate is thinner than the rigid substrate.

In this case, a heat capacity of the flexible substrate is low, so that it is possible to further suppress heat transmission even when the fuse portion generates heat, and effectively fuse the fuse portion in a shorter time.

Preferably, a metal film is formed on a side surface of the intermediate connection layer.

Consequently, the both principal surfaces of the rigid substrate are electrically connected with the metal film of a thick conductor thickness compared to vias, so that it is possible to further reduce the ESR. Further, by forming this metal film, a bonding state where the wiring substrate and the intermediate connection layer are bonded is a splayed state. Consequently, it is possible to easily form a good fillet and obtain a good finished state.

Further, preferably, the flexible substrate is mainly made of a heat resistance resin material.

In this case, the flexible substrate has heat resistance, so that it is possible to effectively avoid firing, fuming and burning out of the intermediate connection layer and the wiring substrate.

Further, preferably, the conductive bonding agent is preferably made of a solder material.

Still further, preferably, the conductive bonding agent is applied to the rigid substrate by using a printing method.

By using a printing method such as screen printing, it is possible to more evenly and uniformly apply the conductive bonding agent to the rigid substrate.

Since the flexible substrate and the rigid substrate are separately made, and are bonded with the conductive bonding agent interposed therebetween, it is not necessary to make the intermediate connection layer by using an expensive rigid flexible substrate of an integrated structure. Consequently, it is possible to easily manufacture the electronic device in which an ESR is reduced and which has a desired fuse function at low cost. Further, the flexible substrate and the rigid substrate are bonded by the conductive bonding agent, so that it is not necessary to adhere the rigid substrate and the flexible substrate by an adhesive for temporal adhesion, either, and it is possible to simplify the manufacturing process. Furthermore, the conductive bonding agent is applied to the rigid substrate to secure electrical conduction in the intermediate connection layer via the conductive bonding agent, so that it is not necessary to perform via processing for making conduction vias and plate processing. Still further, even when heat loads are repeatedly applied at fixed cycles, it is possible to prevent occurrence of a disconnection failure.

DETAILED DESCRIPTION OF THE INVENTION

Next, an embodiment of the present invention will be described in detail with reference to the accompanying drawings.

Figure 1:
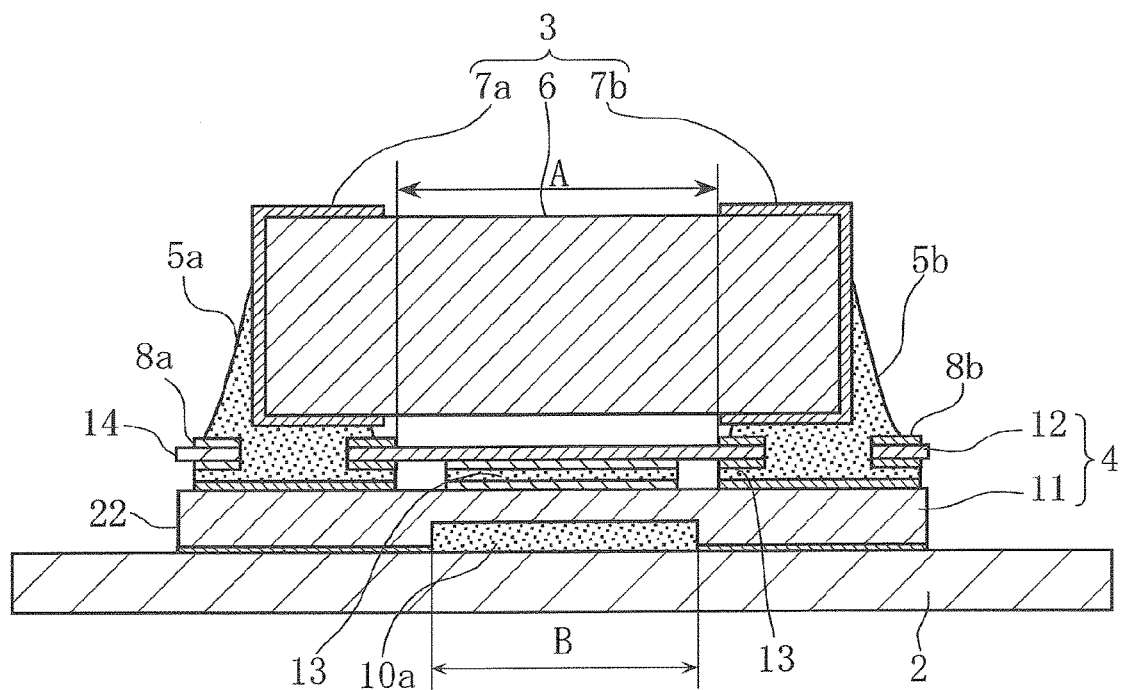
FIG. 1 is a sectional view illustrating an electronic device according to one embodiment of the present invention.
Figure 2:
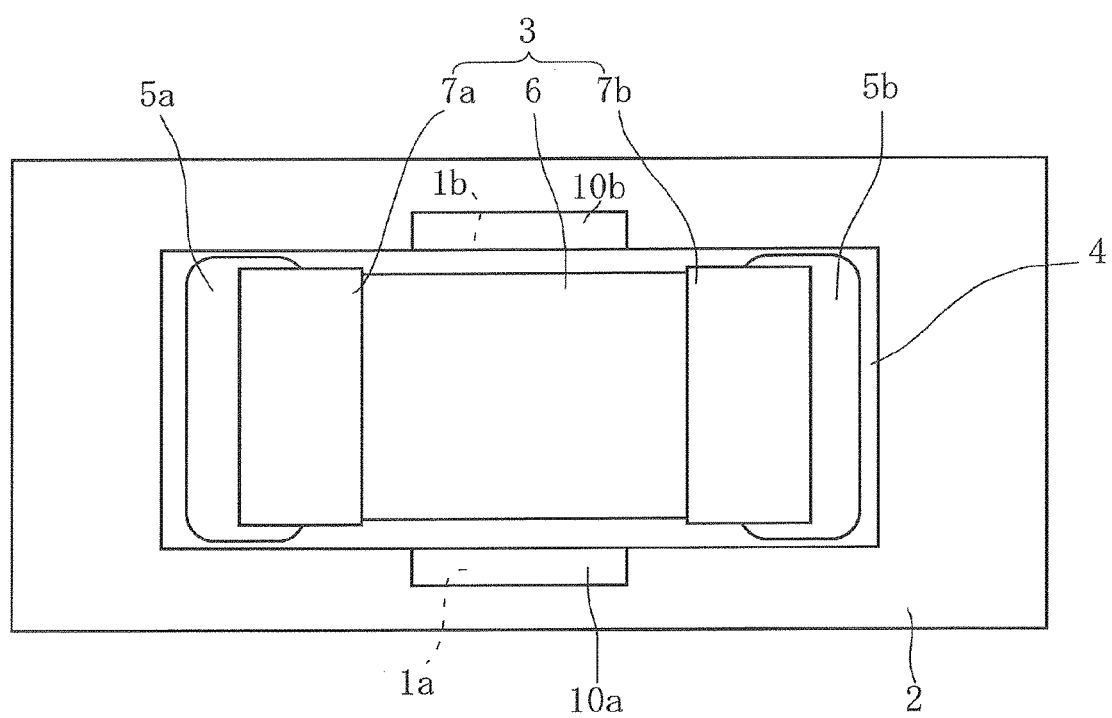
FIG. 2 is a plan view of FIG. 1.

FIG. 1 is a sectional view schematically illustrating an electronic device according to one embodiment of the present invention, and FIG. 2 is a plan view of FIG. 1.

This electronic device includes a wiring substrate 2 on which first and second land electrodes 1a and 1b are formed on a surface, and an electronic part 3 such as a chip multilayer ceramic capacitor and the like which is mainly made of a ceramic material. Further, an intermediate connection layer 4 is interposed between the wiring substrate 2 and the electronic part 3, the electronic part 3 is mounted on the intermediate connection layer 4 with solders (conductive bonding agents) 5a and 5b interposed therebetween, and the intermediate connection layer 4 on which the electronic part 3 is mounted is electrically connected to the wiring substrate 2.

First and second external electrodes 7a and 7b are formed at both end portions of a part body 6 of the electronic part 3 made of a ceramic material. These first and second external electrodes 7a and 7b are electrically connected to first and second conductor portions 8a and 8b formed on a surface of the intermediate connection layer 4 with the solders 5a and 5b interposed therebetween. Further, the first and second land electrodes 1a and 1b formed on the surface of the wiring substrate 2 are electrically connected to the intermediate connection layer 4 with solders 10a and 10b interposed therebetween.

The intermediate connection layer 4 includes a rigid substrate 11 which is mainly made of a rigid material, and a flexible substrate 12 which is mainly made of a flexible material. The rigid substrate 11 and the flexible substrate 12 are bonded with solders 13 interposed therebetween.

Figure 3:
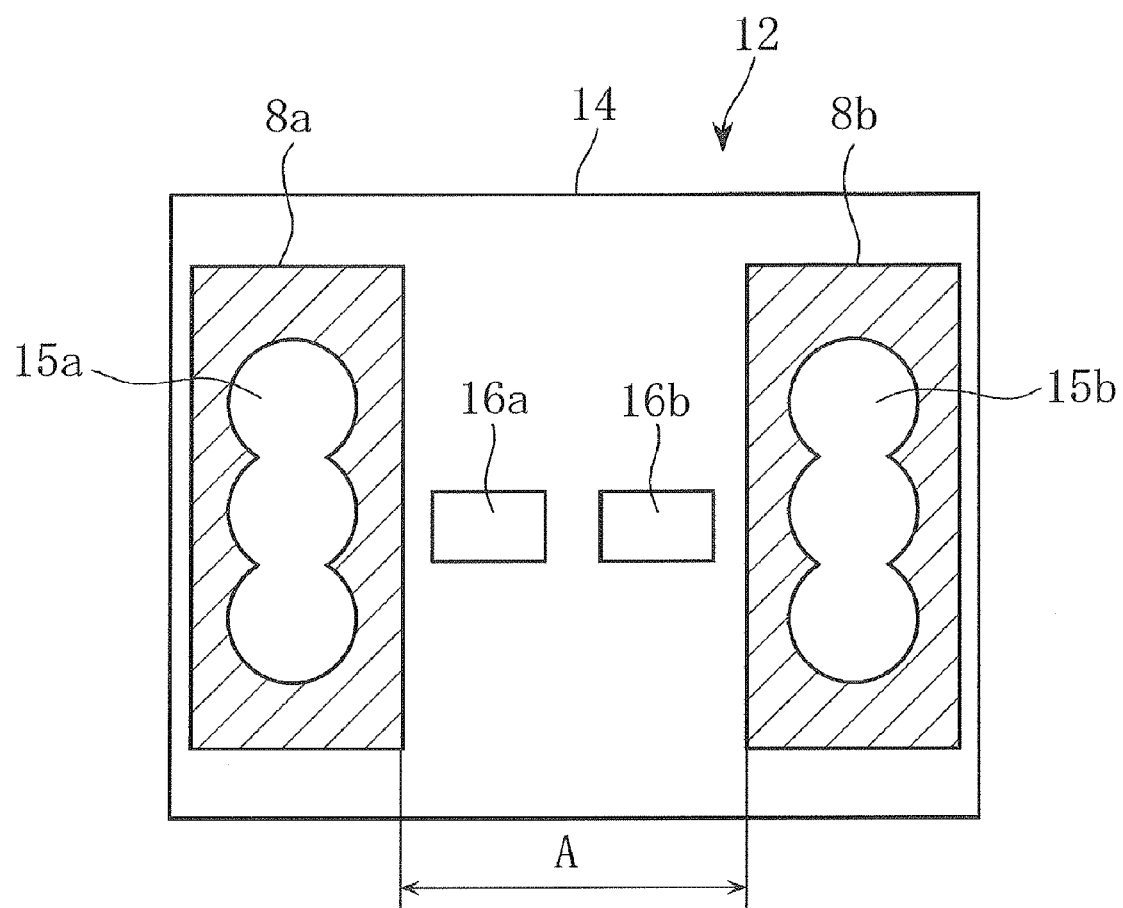
FIG. 3 is a plan view illustrating a flexible substrate according to one embodiment.

FIG. 3 is a plan view of the flexible substrate 12.

As described above, first and second conductor portions 8a and 8b are formed on a top surface (one principal surface) of a flexible mother board 14 in this flexible substrate 12. The first and second conductor portions 8a and 8b are electrically connected with the external electrodes 7a and 7b of the electronic part 3, and are electrically insulated by a conductor portion interval A. Further, first and second through-holes 15a and 15b are formed inside the first and second conductor portions 8a and 8b. Furthermore, a pair of window portions 16a and 16b are formed at positions corresponding to both sides of the fuse portion described below on this flexible substrate 12.

Figure 4:
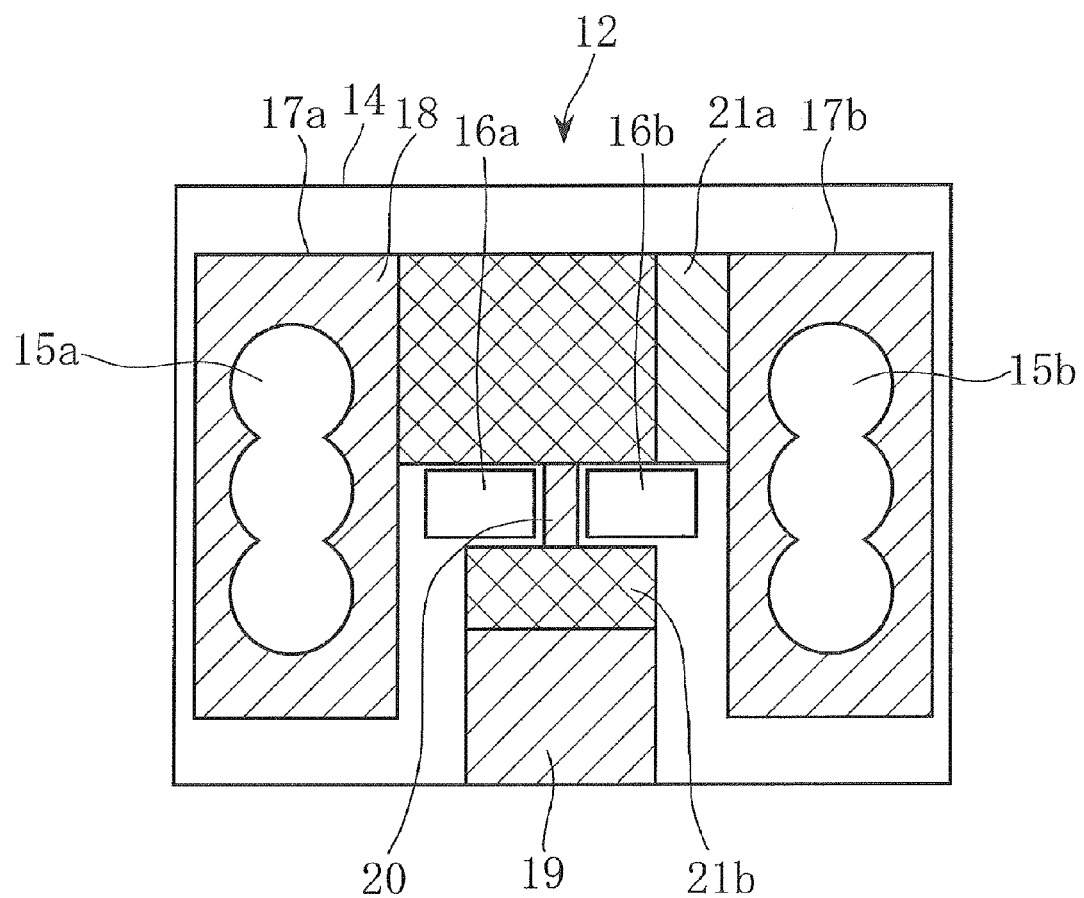
FIG. 4 is a bottom view illustrating the flexible substrate according to one embodiment.

FIG. 4 is a bottom view of the flexible substrate 12.

Third and fourth conductor portions 17a and 17b are formed on a back surface (the other principal surface) of the flexible mother board 14 in this flexible substrate 12.

The third conductor portion 17a includes a main conductor portion 18 which is formed in a nearly L shape, a sub conductor portion 19 which is formed along one side surface of the flexible mother board 14 and at a nearly center portion of the flexible mother board 14, and a fuse portion 20 which connects the main conductor portion 18 and the sub conductor portion 19. The fuse portion 20 is formed in a narrow shape and is positioned between the first and second window portions 16a and 16b.

Further, the fourth conductor portion 17b is formed in the substantially same shape as that of the second conductor portion 8b.

Furthermore, protection films 21a and 21b composed of solder resists and the like are formed to prevent electrical contact between the third conductor portion 17a and the fourth conductor portion 17b with the solders 13 interposed therebetween.

A substrate material used for the flexible substrate 12, i.e., the flexible mother board 14 is not limited in particular as long as a material having flexibility is mainly used. However, generally, a material mainly made of polyimide having good heat resistance is preferably used.

Thus, the flexible substrate 12 has heat resistance, so that, even when such a current that the fuse portion 20 is not instantaneously fused flows and the fuse portion 20 generates heat, it is possible to prevent the intermediate connection layer 4 and the wiring substrate 2 from firing, fuming or burning out.

The thickness of the flexible mother board 14 is not limited in particular and is preferably as thin as possible, and is preferably 100 μm or less and is more preferably 12.5 to 25 μm.

By making the flexible mother board 14 thin in this way, it is possible to also make the flexible substrate 12 including the flexible mother board 14 thin. Further, the flexible substrate 12 which is made thin has a low heat capacity. Even when the fuse portion 20 generates heat, it is more difficult to transmit heat to the surroundings, and it is possible to fuse the fuse portion 20 in a shorter time.

Figure 5:
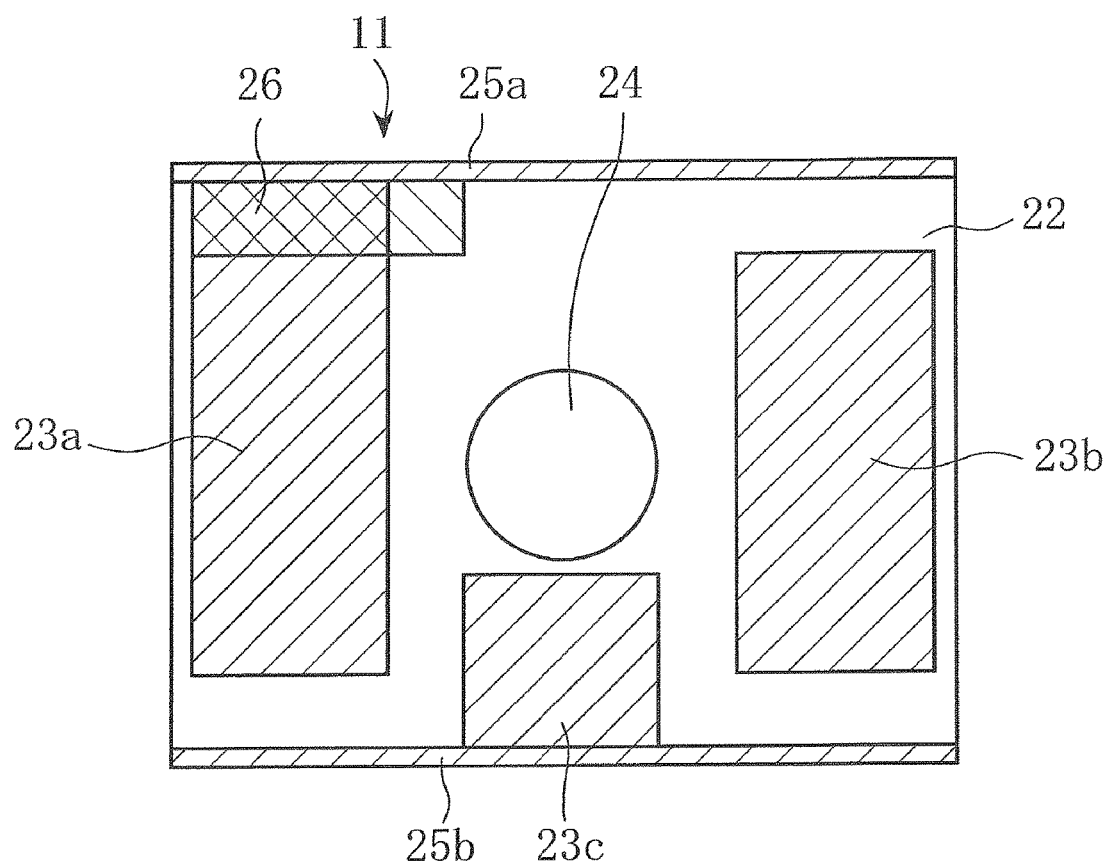
FIG. 5 is a plan view illustrating a rigid substrate according to one embodiment.

FIG. 5 is a plan view of the rigid substrate 11.

Fifth to seventh conductor portions 23a to 23c of this rigid substrate 11 are formed on a top surface (one principal surface) of a rigid mother board 22. More specifically, the fifth and sixth conductor portions 23a and 23b are formed in rectangular shapes near both end portions of the rigid mother board 22, and the seventh conductor portion 23c is formed in a form lying along one side surface of the rigid mother board 22 and at a nearly center portion of the rigid mother board 22 and similar to the sub conductor portion 19 of the third conductor portion 17a. Further, an opening 24 is formed penetrate a nearly center of this rigid mother board 22, i.e., between the fifth conductor portion 23a and the sixth conductor portion 23b. Furthermore, metal films 25a and 25b are formed on both side surfaces of the rigid mother board 22.

A metal material used for the metal films 25a and 25b is not limited in particular yet, and is generally formed by using the same metal material as that of the first to seventh conductor portions 8a, 8b, 17a, 17b and 23a to 23c and eighth and ninth conductor portions described below. When, for example, each of these conductor portions is made of Cu, the metal films 25a and 25b are also generally made of Cu.

The metal films 25a and 25b are formed on the side surface of the rigid substrate 11 which forms the intermediate connection layer 4. Consequently, a connection state of the wiring substrate 2 and the intermediate connection layer 4, which are soldered together, is a splayed state. Consequently, it is possible to easily form a good fillet and obtain a good finished state.

In addition, a protection film 26 composed of a solder resist and the like is formed on this rigid substrate 11 to prevent electrical contact between the fifth conductor portion 23a and the sixth conductor portion 23b with the metal film 25a interposed therebetween.

Figure 6:
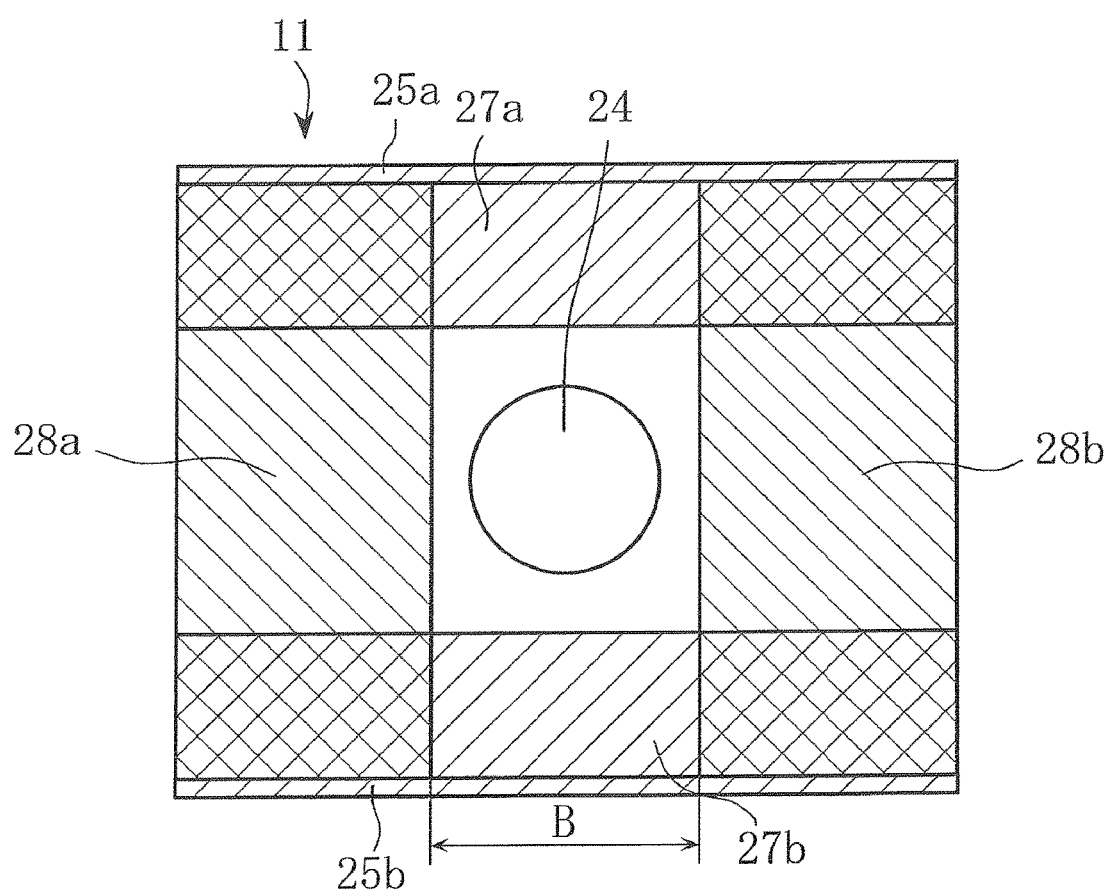
FIG. 6 is a bottom view illustrating the rigid substrate according to one embodiment.

FIG. 6 is a bottom view of the rigid substrate 11.

The back surface (the other principal surface) of the rigid mother board 22 is formed such that eighth and ninth conductor portions 27a and 27b lie along the side surfaces of the rigid mother board 22 orthogonally to the fifth and sixth conductor portions 23a and 23b. In this way, bonding directions of the first and second conductor portions 8a and 8b of the flexible substrate 12 on which the electronic part 3 is mounted, and the eighth and ninth conductor portions 27a and 27b of the rigid substrate 11 connected to the wiring substrate 2 are orthogonal. Consequently, compared to a case where the first and second conductor portions 8a and 8b and the eighth and ninth conductor portions 27a and 27b are formed in the same direction, even when the intermediate connection layer 4 is mounted on the wiring substrate and then the wiring substrate 2 is warped by post-processing, it is possible to suppress a deformation amount of the intermediate connection layer 4 and improve a warp strength of the electronic device.

Further, protection films 28a and 28b composed of solder resists and the like are formed on the back surface of this rigid mother board 22 such that a bonding distance B between the solders 10a and 10b is shorter than the conductor portion interval A to improve a mechanical strength of the electronic device.

That is, a substrate material which forms the rigid substrate 11, i.e., the rigid mother board 22 is not particularly limited as long as a material having rigidity is mainly used. A glass epoxy resin is preferably used. In this case, a ceramic material which is a main component of the part body 6 and the glass epoxy resin which forms the wiring substrate 2 differ in linear expansion coefficients. Hence, when heat loads are repeatedly applied, there is a concern that a stress concentrates on the solders 5a and 5b which connect the electronic part 3 and the intermediate connection layer 4, and a structural defect such as a crack is produced in the solders 5a and 5b.

However, when the bonding distance B is set shorter than the conductor portion interval A (B<A), and even when heat loads are repeatedly applied, the intermediate connection layer 4 readily deforms so that a stress is alleviated. As a result, it is possible to alleviate the stress produced in the solders 5a and 5b, and thereby suppress a structural defect such as a crack, and improve the mechanical strength of the electronic device.

In this regard, the thickness of the rigid mother board 22 is not particularly limited, and, for example, a rigid mother board having a thickness of approximately 0.2 to 1.0 mm can be used.

Figure 7:
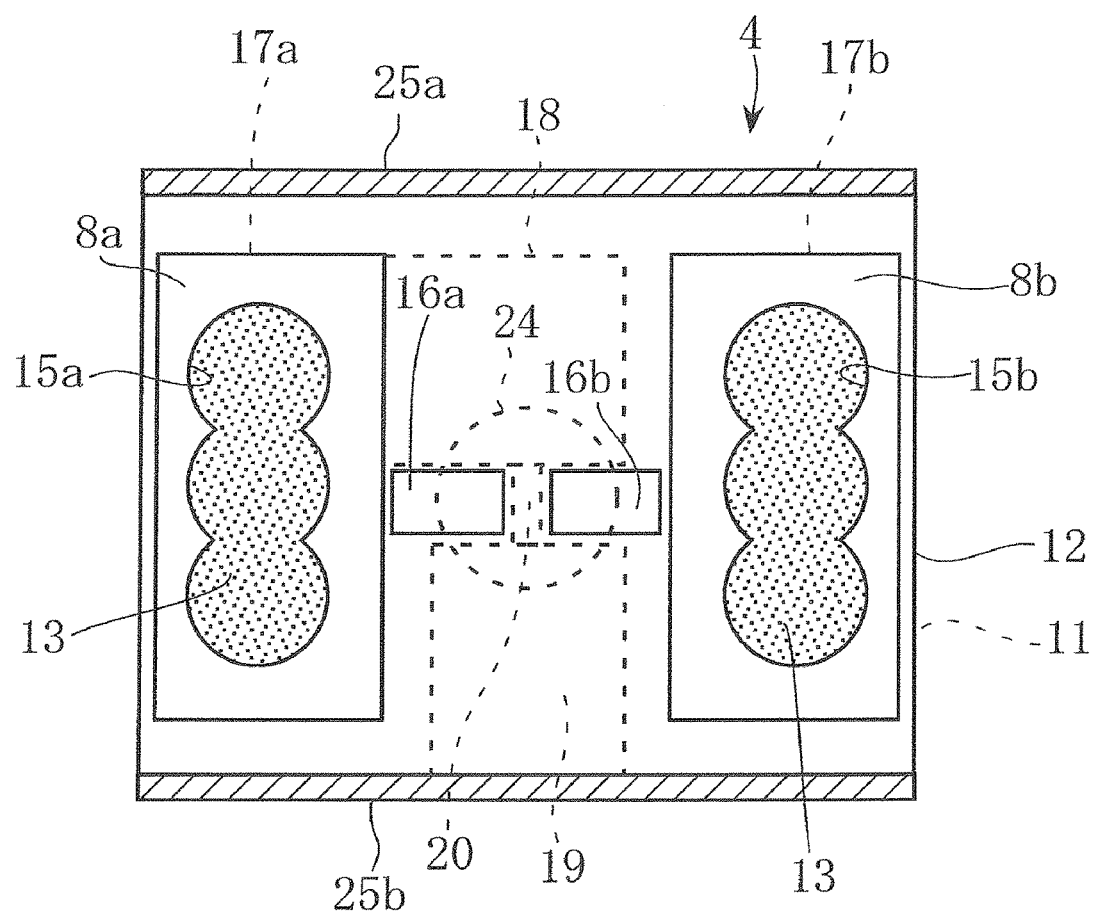
FIG. 7 is a plan view of an intermediate connection layer.

FIG. 7 is a plan view of the intermediate connection layer 4.

That is, in the intermediate connection layer 4, the flexible substrate 12 and the rigid substrate 11 are bonded with the solders 13 interposed therebetween, and the solders 13 are filled in the first and second through-holes 15a and 15b of the flexible substrate 12. Further, the first external electrode 7a of the electronic part 3 is bonded at the bonding distance B to the land electrode 1a of the wiring substrate 2 with the first conductor portion 8a, the solder 13, the third conductor portion 17a, the solder 13, the fifth and seventh conductor portions 23a and 23c, the metal film 25b, the ninth conductor portion 27b and the solder 10a interposed therebetween. Meanwhile, the second external electrode 7b of the electronic part 3 is bonded at the bonding distance B to the land electrode 1b of the wiring substrate 2 with the second conductor portion 8b, the solder 13, the fourth conductor portion 17b, the solder 13, the sixth conductor portion 23b, the metal film 25a, the eighth conductor portion 27a and the solder 10b interposed therebetween.

The electronic part 3 is mounted on the flexible substrate 12 of the intermediate connection layer 4 in this way, and the rigid substrate 11 of the intermediate connection layer 4 is electrically connected to the wiring substrate 2.

According to the electronic device formed in this way, it is not necessary to secure conductivity between the electronic part and the wiring substrate by providing a plurality of conduction vias of small hole diameters in the intermediate connection layer unlike an intermediate connection layer formed by a rigid flexible substrate of a conventional integrated structure. The conductivity is secured by solder-bonding, so that it is possible to reduce the ESR.

Further, on the rigid substrate 11, the seventh conductor portion 23c and the ninth conductor portion 27b are electrically connected with the metal film 25b interposed therebetween, and the sixth conductor portion 23b and the eighth conductor portion 27a are electrically connected with the metal film 25a interposed therebetween. That is, according to the present embodiment, conductivity is secured between both principal surfaces of the rigid substrate 11 by the thick and/or wide metal films 25a and 25b unlike a case where conductivity is secured by the conduction vias, so that it is possible to further reduce the ESR.

Further, even when the electronic part 3 is mounted on the flexible substrate 12 with the solders 5a and 5b interposed therebetween, the fuse portion 20 faces the opening 24 of the rigid substrate 11. Consequently, it is possible to visually check an adherence state where the solders 5a and 5b are attached to the fuse portion 20 and easily perform external appearance inspection.

Further, according to the present embodiment, the rigid substrate 11 and the flexible substrate 12 are bonded with the solders 13 interposed therebetween, so that it is possible to easily fix the rigid substrate 11 and the flexible substrate 12 to predetermined positions without additionally using an adhesive for temporal adhesion.

Further, the fuse portion 20 is formed at the back surface side of the flexible substrate 12 facing the rigid substrate 11 without directly contacting the solders 13. Consequently, even when such a current that the fuse portion 20 is not instantaneously fused flows and the fuse portion 20 generates heat, it is possible to suppress heat transmission to surroundings, fuse the fuse portion 20 in a short time and prevent the intermediate connection layer 4 and the wiring substrate 2 from firing in advance.

Further, according to the present embodiment, the fuse portion 20 is provided at the back surface side of the flexible substrate 12 facing the rigid substrate 11 as described above, so that it is possible to more effectively reduce the ESR compared to a case where the fuse portion is provided at the top surface side of the flexible substrate 12.

Figure 8:
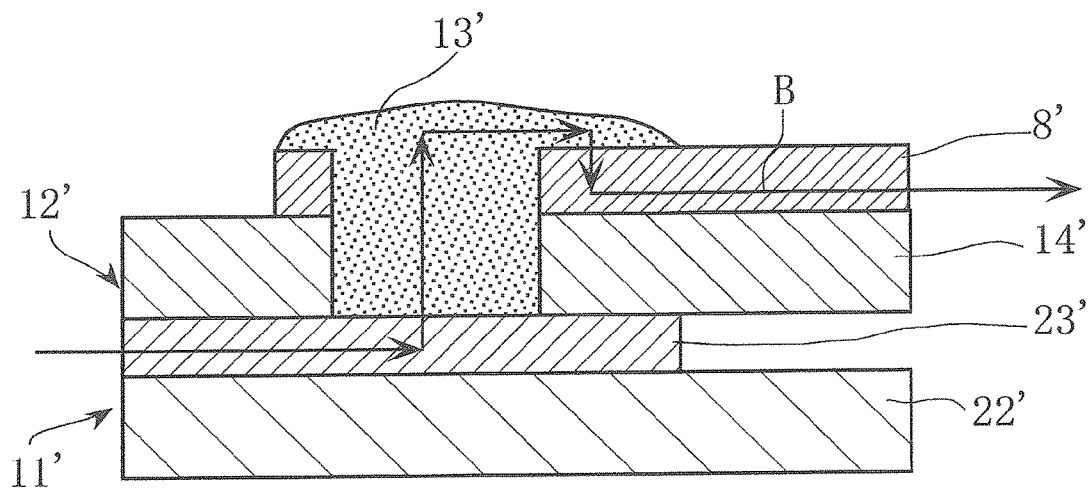
FIG. 8 is a sectional view of the intermediate connection layer illustrating a current path according to a comparative example.
Figure 9:
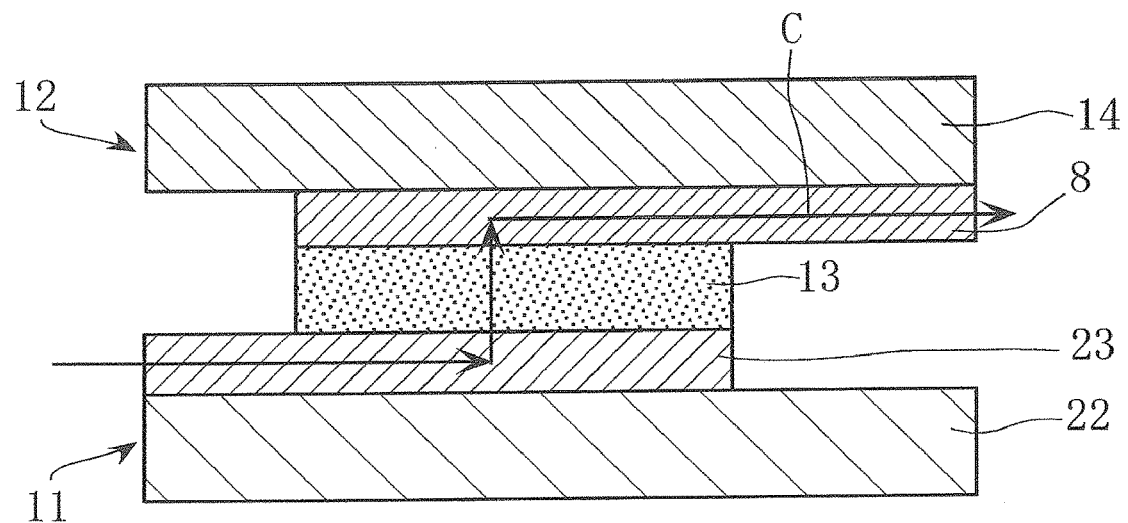
FIG. 9 is a sectional view of the intermediate connection layer illustrating a current path according to the present embodiment.

That is, FIG. 8 is a sectional view of main components schematically illustrating an intermediate connection layer according to a comparative example, and FIG. 9 is a sectional view of main components schematically illustrating the intermediate connection layer according to the present embodiment.

According to the comparative example of FIG. 8, a conductor portion 23' is formed on a top surface of a rigid mother board 22' on a rigid substrate 11', and a flexible substrate 12' is formed on a top surface of the rigid substrate 11'.

Further, a conductor portion 8' including a fuse portion is formed on a top surface of a flexible mother board 14' on the flexible substrate 11', a through-hole is formed in the flexible mother board 14' and a solder 13' is formed to cover part of the conductor portion 8'.

Furthermore, according to this comparative example, when a voltage is applied to an electronic device, as indicated by an arrow B, a current passes through the solder 13' from the conductor portion 23', and passes through the conductor portion 8' including the fuse portion above the flexible substrate 12'.

In contrast, according to the present embodiment in FIG. 9, the conductor portion 23 is formed on the top surface of the rigid mother board 22 of the rigid substrate 11, the conductor portion 8 including the fuse portion is formed at the back surface side of the flexible mother board 14 on the flexible substrate 12, and the rigid substrate 11 and the flexible substrate 12 are bonded with the solder 13 interposed therebetween.

Further, according to the present embodiment, when a voltage is applied to the electronic device, as indicated by an arrow C, a current passes through the solders 13 from the conductor portion 23, and passes through the conductor portion 8 at the back side of the flexible substrate 12.

That is, according to the present embodiment, the current passes through the back surface side of the flexible substrate 12 without passing through the top surface side of the flexible substrate 12' unlike the comparative example, so that current paths are short and it is possible to reduce the ESR.

Further, even when such a current that the fuse portion 20 is not instantaneously fused flows, the electronic device can suppress heat transmission of heat generated from the fuse portion 20 to surroundings, fuse the fuse portion 20 in a short time and prevent firing of the intermediate connection layer 4 and the wiring substrate 2 in advance.

Next, a method for manufacturing the electronic device will be described in detail.

The electronic device of this type is generally manufactured by adopting a multipiece making method for mounting multiple electronic parts on a large-sized substrate from a viewpoint of productivity, vertically and horizontally cutting and singulating this large-sized substrate and efficiently obtaining the electronic device.

Hence, the method for obtaining the electronic device according to the multipiece making method will be described in the present embodiment, too.

Figure 10:
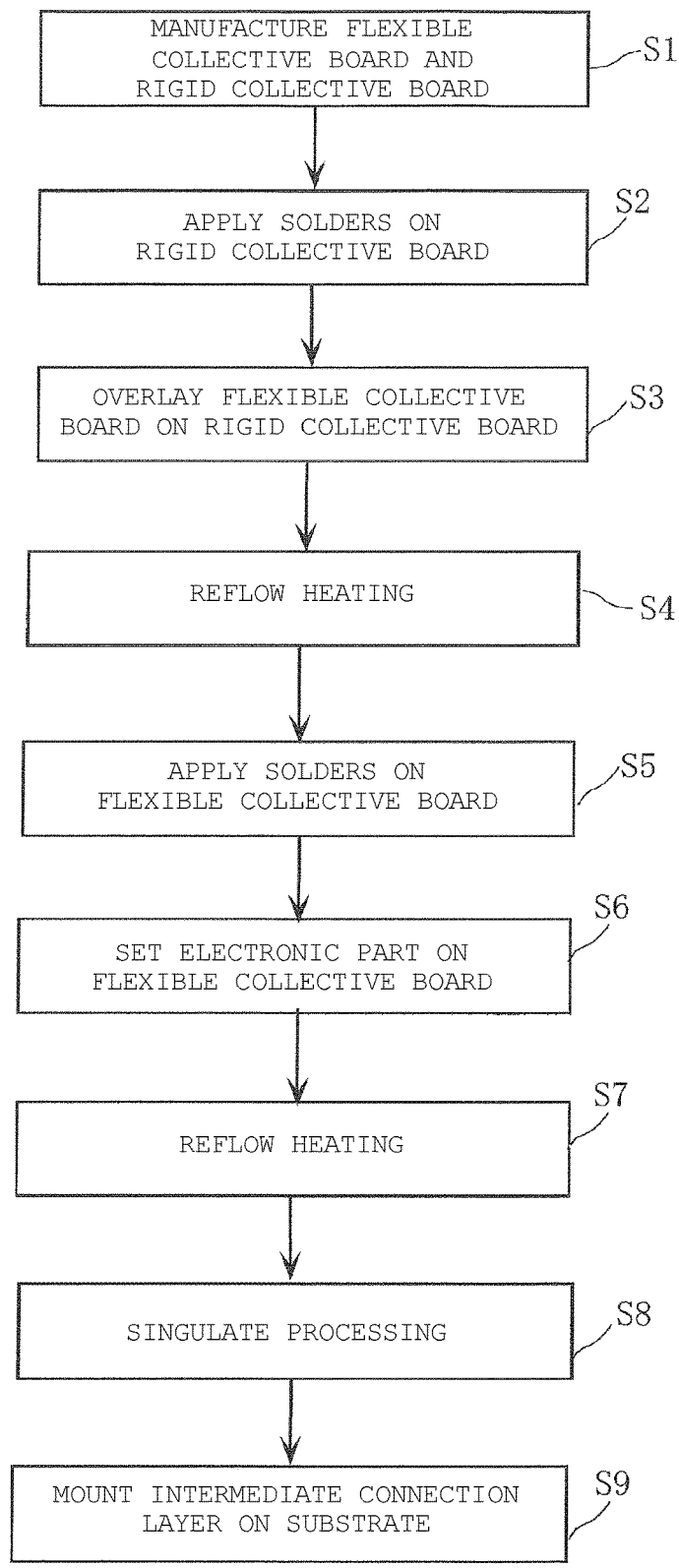
FIG. 10 is a flowchart according to an electronic device manufacturing method according to the present invention.

FIG. 10 is a flowchart illustrating a manufacturing processing of the method for manufacturing the electronic device.

First, in step S1, a flexible collective board which is a collective body of flexible substrates, and a rigid collective board which is a collective body of rigid substrates are separately made.

Figure 11:
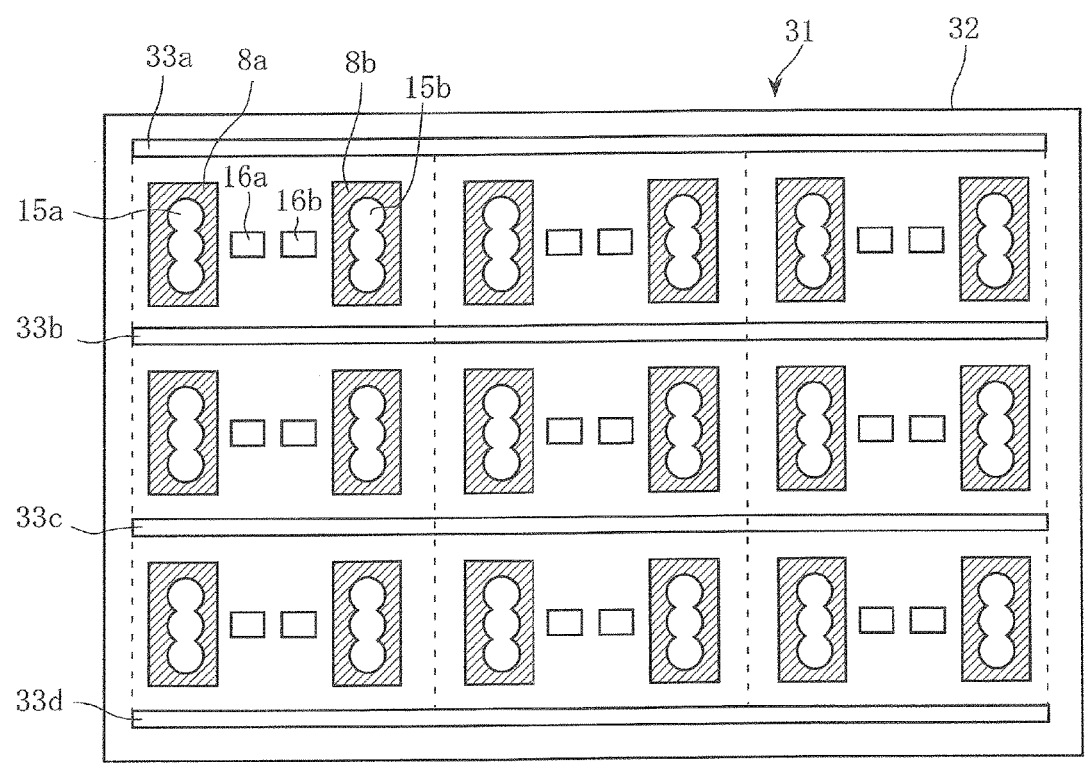
FIG. 11 is a plan view illustrating a flexible collective board according to one embodiment.

FIG. 11 is a view for explaining a method for manufacturing a flexible collective board 31.

First, a large-sized flexible mother board 32 made of a polyimide resin or the like is prepared. The thickness of this flexible mother board 32 is not limited in particular and is preferably as thin as possible from a viewpoint of purposes for suppressing heat diffusion of the singulated flexible substrate 12 and making it easy to fuse the fuse portion 20, and is preferably 100 μm or less and is more preferably 12.5 to 25 μm.

Further, a known photolithography technique is applied to this large-sized flexible mother board 32 to make a plurality of conductor portion groups in which the first and second conductor portions 8a and 8b form a pair in a matrix pattern on a top surface of the flexible mother board 32. Similarly, a plurality of conductor portion groups in which the third and fourth conductor portions 17a and 17b form a pair is formed in a matrix pattern on a back surface side of the flexible mother board 32, too, and solder resists and the like are applied to predetermined portions to prevent electrical contact between the third and fourth conductor portions 17a and 17b and are dried to from the protection layers 21a and 21b (see FIGS. 3 and 4). Next, a drilling machine such as a drill is used to make the first and second through-holes 15a and 15b inside the first and second conductor portions 8a and 8b or the third and fourth conductor portions 17a and 17b, and a pair of window portions 16a and 16b are made by irradiating predetermined portions at both sides of the fuse portion on the back side with laser light. Further, a grinding tool such as a grinder is used to form slit openings 33a to 33d at predetermined portions in a longitudinal direction and thereby make the flexible collective board 31.

Figure 12:
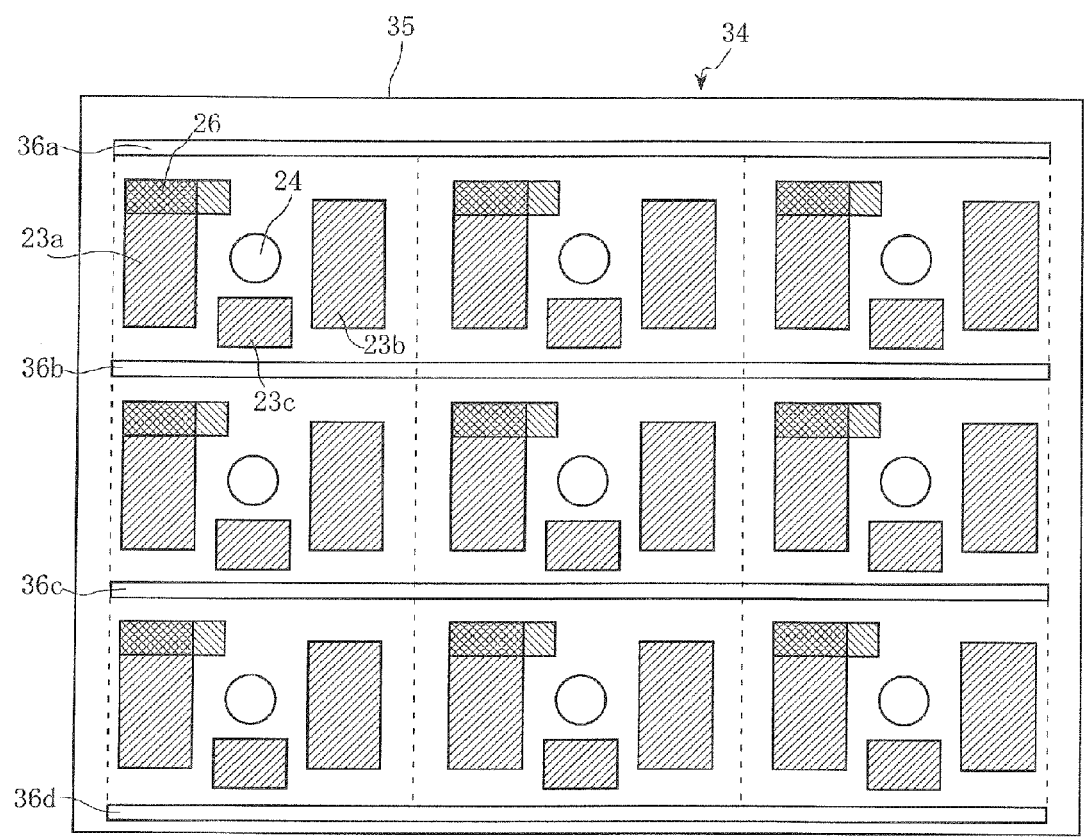
FIG. 12 is a plan view illustrating a rigid collective board according to one embodiment.

FIG. 12 is a view for explaining a method for manufacturing a rigid collective board 34.

First, a large-sized rigid mother board 35 in which metal thin films such as Cu are formed on both top and back surfaces and which is mainly made of a resin material such as a glass epoxy resin is prepared. As described above, the thickness of the rigid mother board 35 may be, for example, approximately 0.2 to 1.0 mm.

Further, positions corresponding to the slit openings 33a to 33d of the flexible mother board 32 are processed on this large-sized rigid mother board 35 by the grinding tool such as the grinder to form the slit openings on the rigid mother board 35, too. Subsequently, plating processing such as electrolytic plating or non-electrolytic plating is applied to the slit openings to form metal materials 36a to 36d which are the metal films 25a and 25b and are made of Cu, on inner walls of the slit openings. Next, the known photolithography technique is applied to make a plurality of conductor portion groups in which the fifth to seventh conductor portions 23a to 23c form a pair, in a matrix pattern on the top surface of the rigid mother board 35, and make a plurality of conductor portion groups in which the eighth and ninth conductor portions 27a and 27b form a pair in a matrix pattern on the back surface of the rigid mother board 35. Next, the drilling machine such as the drill is used to make the opening 24 at the predetermined portion of the rigid mother board 35.

Further, solder resists and the like are applied to predetermined portions on the both top and back surfaces of the rigid mother board 35 to prevent contact between the fifth conductor portion 23a and the sixth conductor portion 23b, and the eighth conductor portion 27a and the ninth conductor portion 27b, and are dried to form protection layers 26 and 28a and 28b (see FIGS. 5 and 6).

Thus, the rigid collective board 34 is made.

Figure 13A:
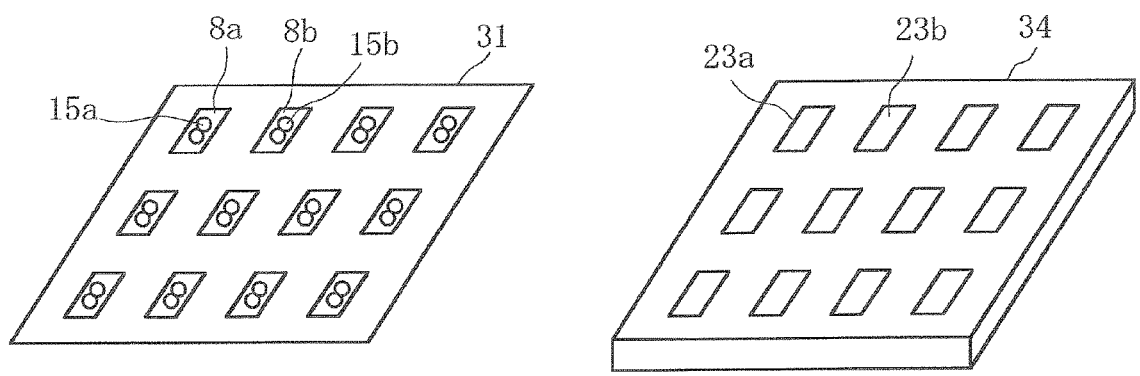
FIGS. 13A and 13B are perspective views (1/4) illustrating a manufacturing process of the manufacturing method according to one embodiment.

Thus, in step S1, the flexible collective board 31 and the rigid collective board 34 are separately made (see FIG. 13A).

Figure 13B:
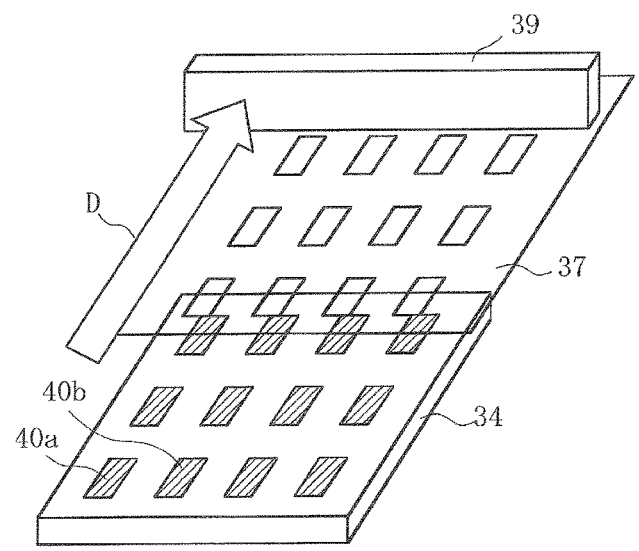

Next, in step S2 (FIG. 10), solder pastes are applied to predetermined portions of the rigid collective board 34. That is, as illustrated in FIG. 13B, a metal mask 37 of a predetermined pattern is used to activate a squeeze 39 in a direction of an arrow D for screen printing, and apply solder pastes 40a and 40b to the predetermined portions on the rigid collective board 34.

Figure 14A:
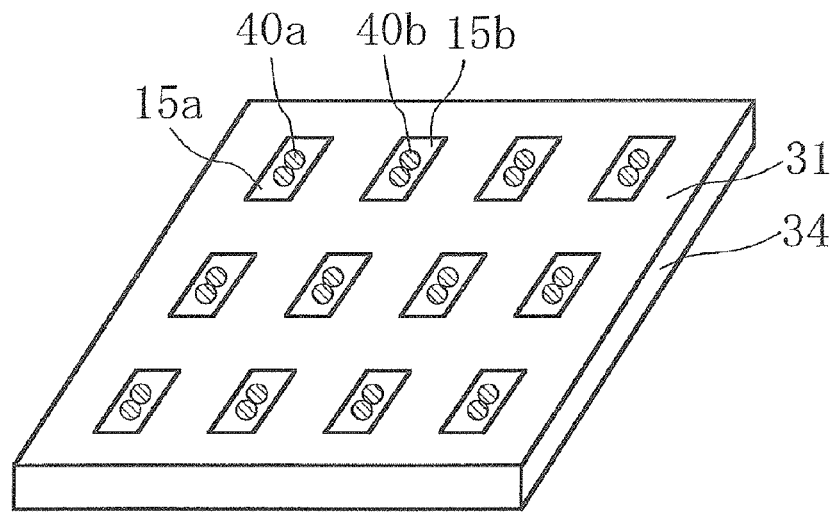
FIGS. 14A and 14B are perspective views (2/4) illustrating the manufacturing process of the manufacturing method according to one embodiment.
Figure 14B:
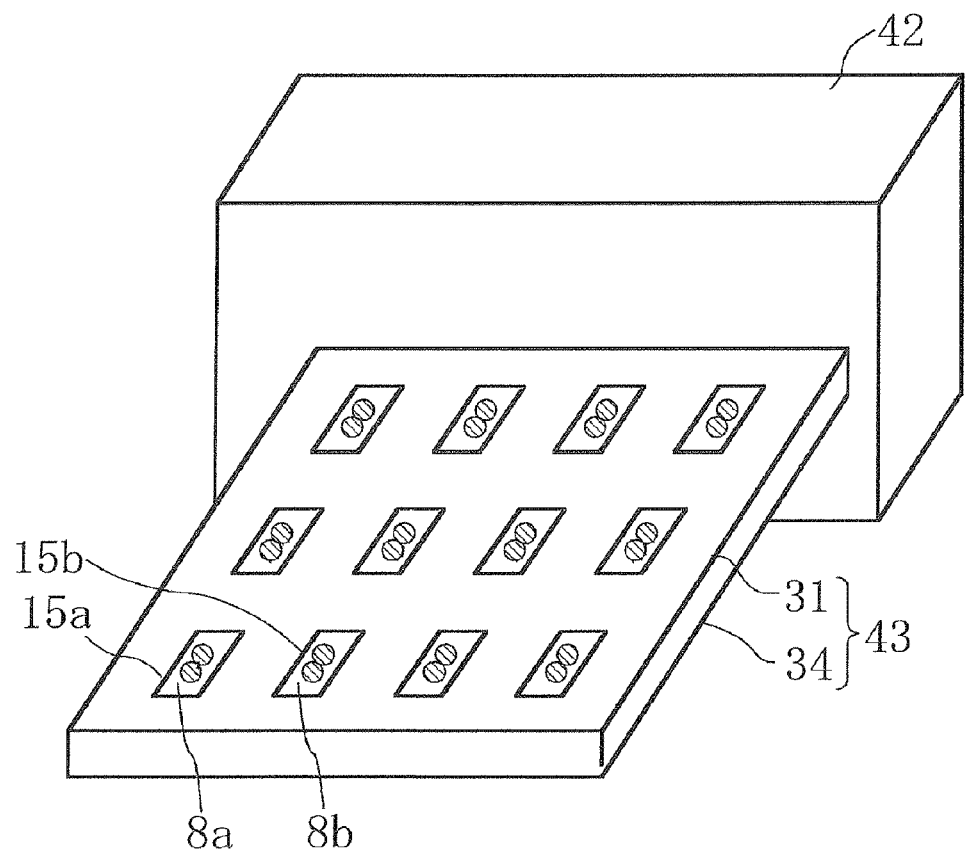

Next, in step S3, as illustrated in FIG. 14A, the flexible collective board 31 is overlaid on the rigid collective board 34 to fill the solder pastes 40a and 40b in the first and second through-holes 15a and 15b. In step S4, as illustrated in FIG. 14B, the flexible collective board 31 is caused to pass through a reflow furnace 42 for reflow heating, and solder pastes 40 are heated and cured. In this way, an intermediate connection layer collective body 43 formed by bonding the flexible collective board 31 and the rigid collective board 34 with the solders 13 interposed therebetween is obtained.

Figure 15A:
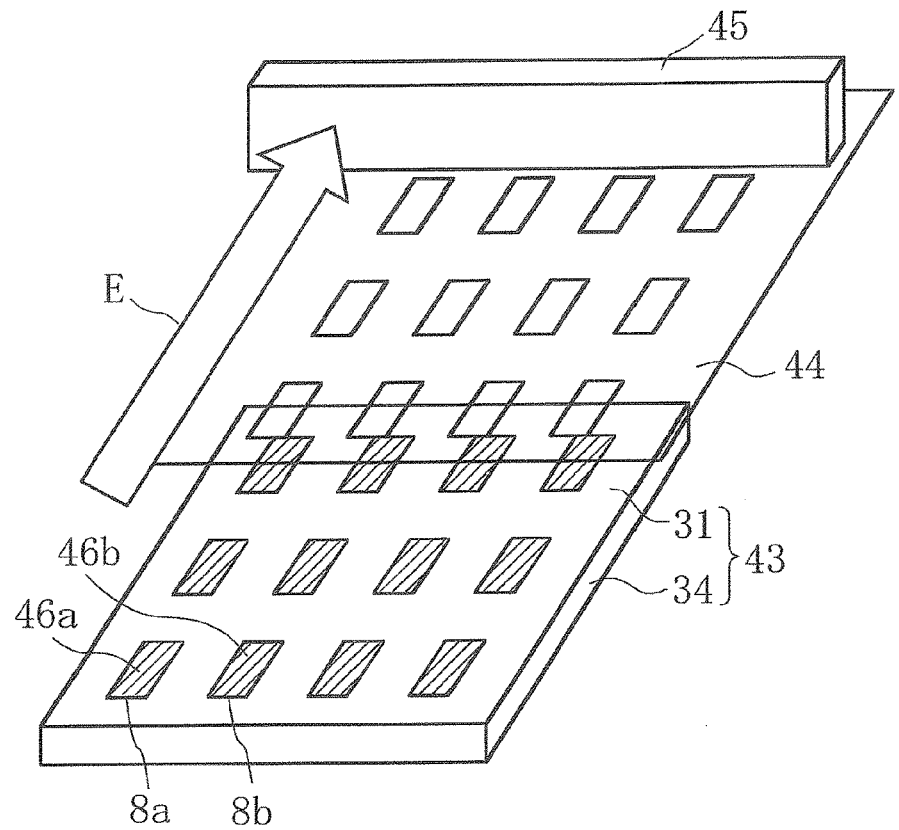
FIGS. 15A and 15B are perspective views (3/4) illustrating the manufacturing process of the manufacturing method according to one embodiment.

Next, in step S5, as illustrated in FIG. 15A, a metal mask 44 of a predetermined pattern is used to activate a squeeze 45 in a direction of an arrow E for screen printing, and apply solder pastes 46a and 46b to first and second conductor portions 8a and 8b.

Figure 15B:
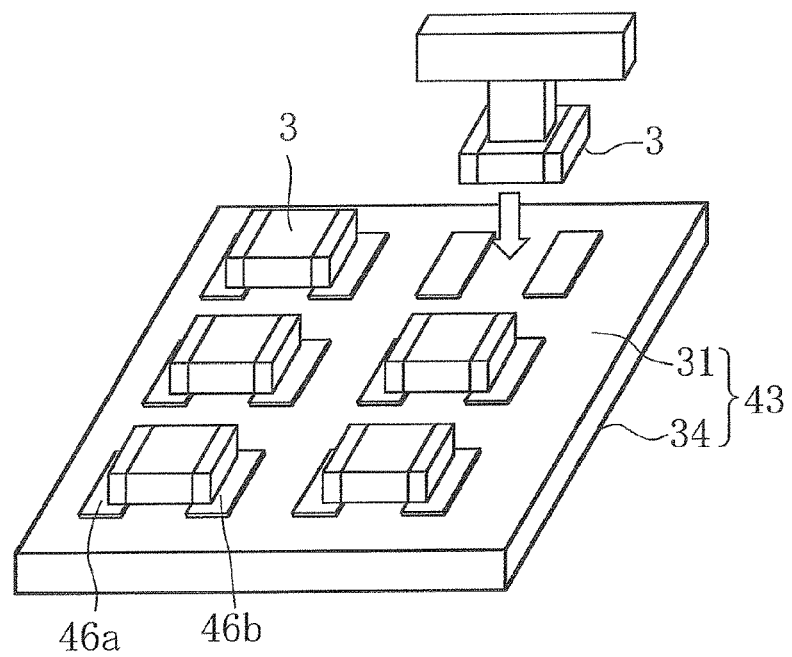
Figure 16A:
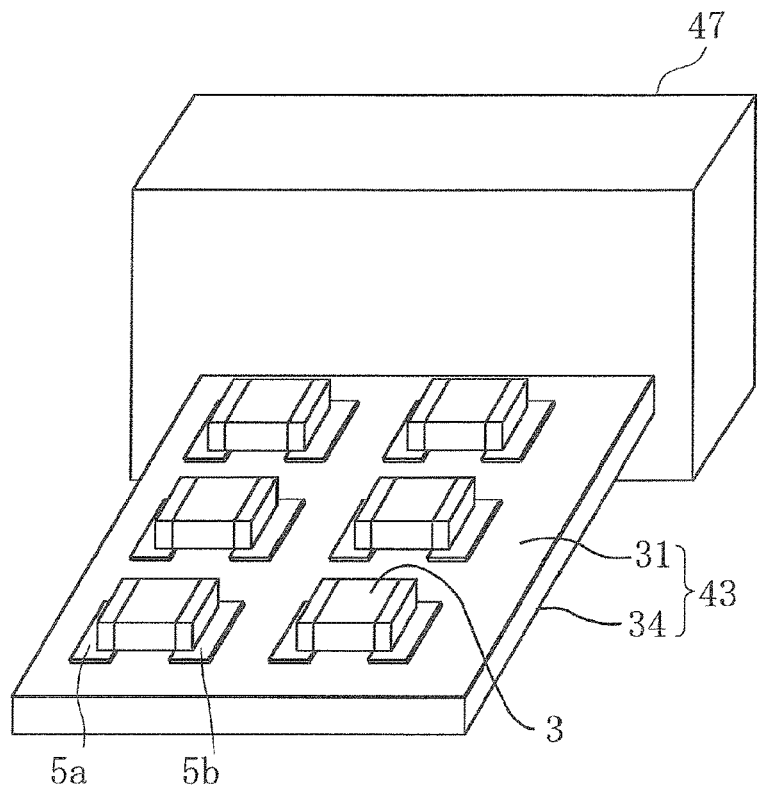
FIGS. 16A and 16B are perspective views (4/4) illustrating the manufacturing process of the manufacturing method according to one embodiment.

Next, in step S6, as illustrated in FIG. 15B, the electronic part 3 is set on the flexible collective board 31. In subsequent step S7, as illustrated in FIG. 16A, the electronic part 3 is caused to pass through the reflow furnace 47 for reflow heating, and thereby is mounted on the flexible collective board 31 with the solders 5a and 5b interposed therebetween.

Figure 16B:
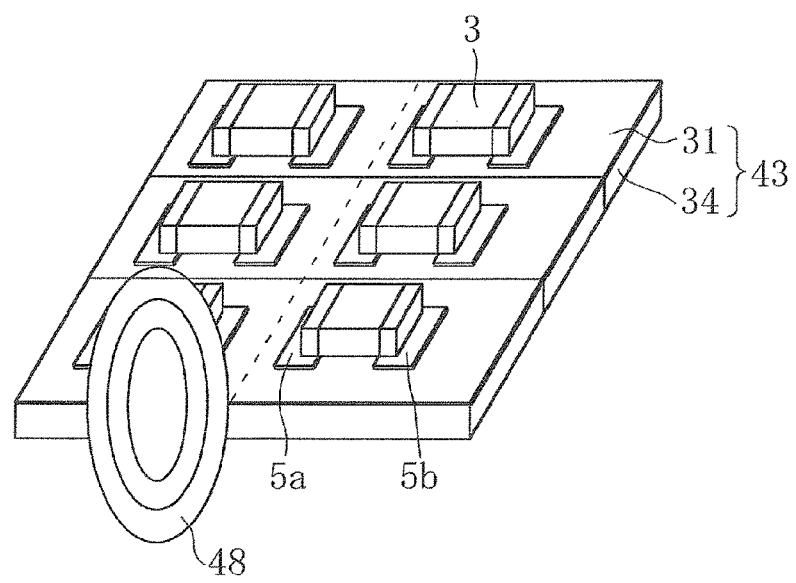

Next, in step S8, as illustrated in FIG. 16B, a cutting machine 48 such as a dicing saw is used to vertically and horizontally cut and singulate the flexible collective board 31.

Next, in step S9, solder pastes are applied at the predetermined bonding distance B on the land electrodes 1a and 1b of the wiring substrate 2, are caused to pass through the reflow furnace again, and are heated and solidified, so that the intermediate connection layer 4 is electrically connected to the wiring substrate 2 with the solders 10a and 10b interposed therebetween and an electronic device is manufactured.

This manufacturing method includes a mother board preparing process of preparing the rigid mother board 22 which is mainly made of a rigid material and a flexible mother board 14 which is mainly made of a flexible material, a flexible substrate making process of forming the first to fourth conductor portions 8a, 8b, 17a and 17b which are electrically insulated from each other, on the both principal surfaces of the flexible mother board 14, forming the third conductor portion 17a including the fuse portion 20, and forming the first and second through-holes 15a and 15b inside the first and second conductor portions 8a and 8b (or the third and fourth conductor portions 17a and 17b), a rigid substrate making process of forming the fifth to ninth conductor portions 23a to 23c, 27a and 27b which are electrically insulated from each other, on both principal surfaces of the rigid mother board 22, and forming the opening 24 at a center portion of the rigid mother board 22, an applying process of applying the solders 13 on the rigid substrate 11 to prevent contact between the fifth conductor portion 23a and the sixth conductor portion 23b, and an intermediate connection layer forming step of disposing the flexible substrate 12 and the rigid substrate 11 such that the fuse portion 20 faces the opening 24, filling the solders 13 in the first and second through-holes 15a and 15b, bonding the flexible substrate 12 and the rigid substrate 11 with the solders 13 interposed therebetween, and forming the intermediate connection layer 4. Since the flexible substrate 12 and the rigid substrate 11 are separately made and bonded to each other with soldering, so that it is not necessary to make the intermediate connection layer by using an expensive rigid flexible substrate of the integrated structure, and it is possible to easily manufacture the electronic device in which the ESR is reduced and which has the desired fuse function at low cost.

Further, the rigid substrate 11 and the flexible substrate 12 are bonded with the solders 13 interposed therebetween to form the intermediate connection layer 4, so that it is possible to simplify the manufacturing process without requiring an additional adhesive for temporal adhesion for bonding to easily fix the rigid substrate 11 and the flexible substrate 12.

Further, the solders 13 are applied to insides of the first and second through-holes 15a and 15b to secure electrical conduction in the intermediate connection layer 4 via the solder 13. Consequently, it is not necessary to perform via processing for making conduction vias and plate processing, and it is possible to suppress occurrence of a disconnection failure even when heat loads are repeatedly applied at fixed cycles.

In this regard, the present invention is not limited to the embodiment and can be variously modified without departing from the spirit of the present invention. For example, the solder is used as the conductive agent in the embodiment. However, other conductive bonding agents can be naturally used.

Next, an example of the present invention will be specifically described.

EXAMPLE

A multilayer ceramic capacitor was mounted on an intermediate connection layer to conduct a heat cycle test.

[Making of Flexible Substrate]

A flexible mother board was prepared, which was 8.0 mm in length and was 6.2 mm in width, and was formed by adhering a copper foil which was 18 μm in thickness to both top and back surfaces of a polyimide resin which was 25 μm in thickness was prepared.

Next, a photolithography technique was applied to this flexible mother board to form first and second conductor portions which were 4.8 mm in height and were 2.1 mm in width at predetermined portions of a top surface of the flexible mother board. In this regard, the conductor portion interval A was 3.5 mm.

Similarly, a third conductor portion was made also at a back surface side of the flexible mother board, composed of a main conductor portion whose rectangular portion was 4.8 mm in height and 2.05 mm in width and whose portion continuing to this rectangular portion was 1.6 mm in height and 2.5 mm in width, a sub conductor portion which was 2.0 mm in height and 1.6 mm in width, and a fuse portion of a narrow shape connecting the main conductor portion and the sub conductor portion which was 1.0 mm in height and 0.3 mm in width. Further, a fourth conductor portion which was 4.8 mm in height and 2.05 mm in width was made.

Next, a drill was used to make three through-holes which continued in a vertical direction and whose diameter was 1.35 mm, inside the first and second conductor portions, and were irradiated with laser light to provide window portions which were 1.15 mm in height and 0.7 mm in width on both sides of the fuse portion. Further, lastly, solder resists were applied to predetermined portions on a top surface of a flexible mother board and dried to make the flexible substrate illustrated in FIGS. 3 and 4.

[Making of Rigid Substrate]

A rigid mother board in which a copper foil which was 18 μm in thickness was formed on both entire principal surfaces and which was mainly made of a glass epoxy resin which was 8.0 mm in length, 6.2 mm in width and 0.6 mm in thickness was prepared.

Next, the photolithography technique was applied to make fifth and sixth conductor portions which were 4.2 mm in height and 2.05 mm in width near an end surface of the top surface of the rigid mother board, and to make a seventh conductor portion which was 1.85 mm in height and 2.0 mm in width at a nearly center and along a side surface. Further, eighth and ninth conductor portions which were 1.5 mm in height and 3.0 mm in width were made on the back surface of the rigid mother board and orthogonally to the fifth and sixth conductor portions. Furthermore, plating processing was applied to both side surfaces of the rigid mother board to form a Cu film which was 20 μm in thickness.

Still further, lastly, solder resists were applied to predetermined portions on the back surface of the rigid base body and dried to make the rigid substrate illustrated in FIGS. 5 and 6.

[Formation of Intermediate Connection Layer]

Sn—Ag—Cu based solder pastes whose Ag content was 3.0 wt % and whose Cu content was 0.5 wt % were used to apply the solder pastes to predetermined positions of the rigid substrate by way of screen printing, were caused to pass through a reflow furnace which was adjusted to a maximum temperature 235 to 250° C. for reflow heating, and thereby were heated and solidified to make the intermediate connection layer.

[Making of Sample]

A multilayer ceramic capacitor which was 5.7 mm in length, 5.0 mm in width and 2.7 mm in height was prepared.

Next, the screen printing was used to apply the solder pastes to the first and second conductor portions of the flexible substrate, and then set the multilayer ceramic capacitor on the flexible substrate. Further, the flexible substrate was caused to pass through the reflow furnace again to heat and solidify the solder pastes and mount the multilayer ceramic capacitor on the intermediate connection layer.

Next, the solder pastes were screen-printed on the wiring substrate such that the bonding distances B to the rigid substrate were 3 mm, 3.6 mm and 4 mm, the intermediate connection layer was set on the wiring substrate, the wiring substrate was caused to pass through the reflow furnace, and the solder pastes were heated and solidified to make samples of sample numbers 1 to 3.

[Evaluation of Sample]

A heat cycle test was conducted for ten samples of the sample numbers 1 to 3 made as described above to observe the samples by using an optical microscope after the test, and evaluate reliability.

In this regard, the heat cycle test was conducted by using a liquid tank thermal shock testing device and conducting 1000 cycles whose one cycle included a profile of immersing each sample in a low-temperature liquid tank of −55° C. for five minutes and immersing each sample in a high-temperature rank of +125° C. for five minutes.

Figure 17:
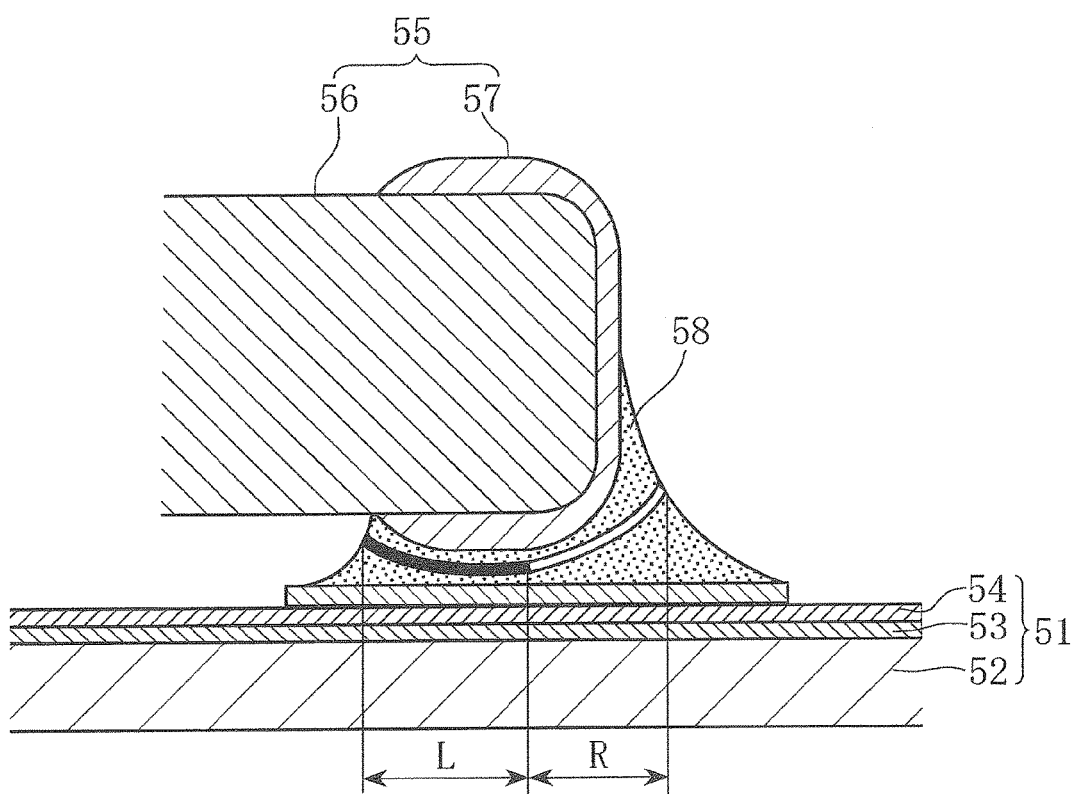
FIG. 17 is a view for explaining a crack growth rate $\chi$.

FIG. 17 is a sectional view schematically illustrating main parts of a measurement sample.

That is, in an intermediate connection layer 51, a solder 54 is interposed between a rigid substrate 52 and a flexible substrate 53. In a multilayer ceramic capacitor 55, an external electrode 57 is formed at an end portion of a part body 56 whose main component is a ceramic material, and the multilayer ceramic capacitor 55 is mounted on the intermediate connection layer 51 with a solder 58 interposed therebetween. In FIG. 17, a black portion indicates a crack length L of a portion at which a crack was produced, and a white portion indicates a remaining portion length R of a portion at which a crack was not produced.

Further, in this example, the crack growth rate $\chi$ was defined according to equation (1) to evaluate reliability.

$$\chi = (L/(L+R)) \times 100 \quad (1)$$

In this regard, L represents the crack length (mm) and R represents the remaining portion length (mm).

That is, as described above, the ceramic material which is the main component of the part body 56 and the glass epoxy resin of which the rigid substrate 52 is mainly made differ in linear expansion coefficients. Therefore, when heat loads are repeatedly applied, a stress tends to concentrate on the solder 58 interposed between the multilayer ceramic capacitor 55 and the intermediate connection layer 51.

Hence, in this example, the crack growth rate $\chi$ was calculated according to equation (1) to evaluate reliability.

Table 1 illustrates a measurement result, and illustrates and a maximum value and a minimum value of each of the ten samples and an average value calculated from each of the crack growth rates $\chi$.

Figure 18:
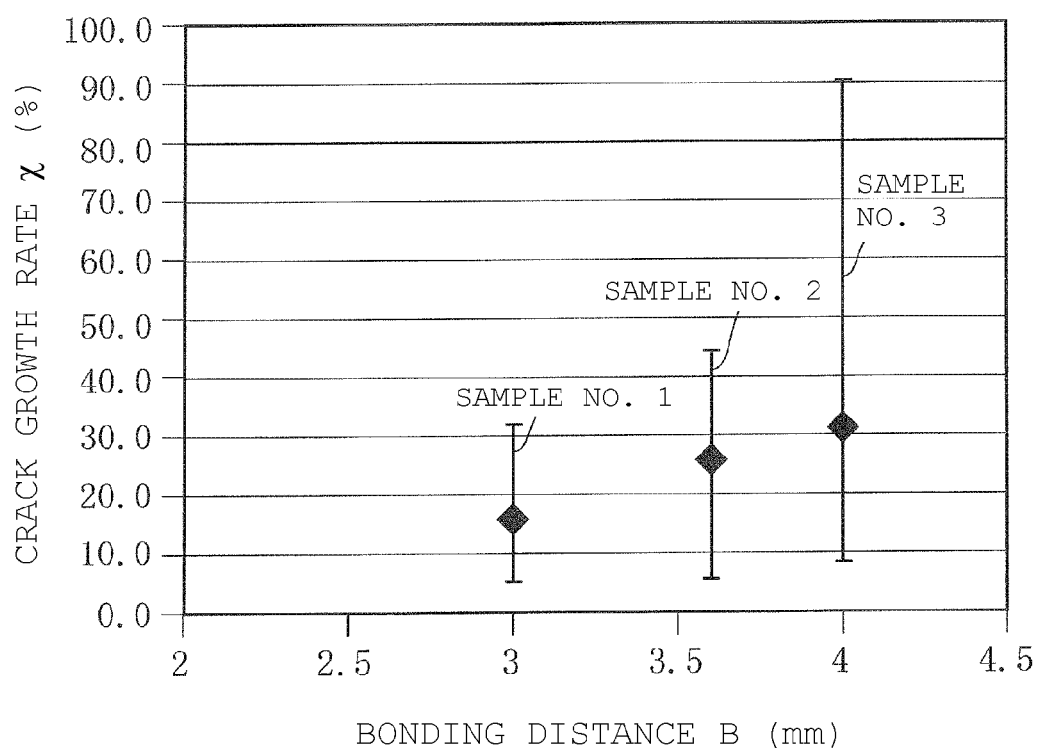
FIG. 18 is a view illustrating a distribution of crack growth rates of each sample of sample numbers 1 to 3.
Figure 19:
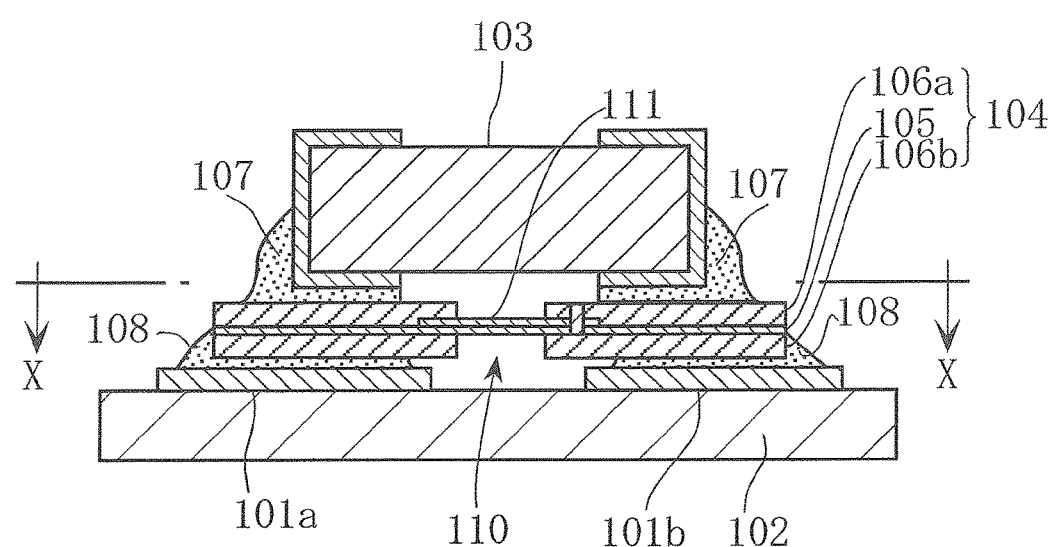
FIG. 19 is a sectional view of an electronic device disclosed in International Publication No. 2016/039260.
Figure 20:
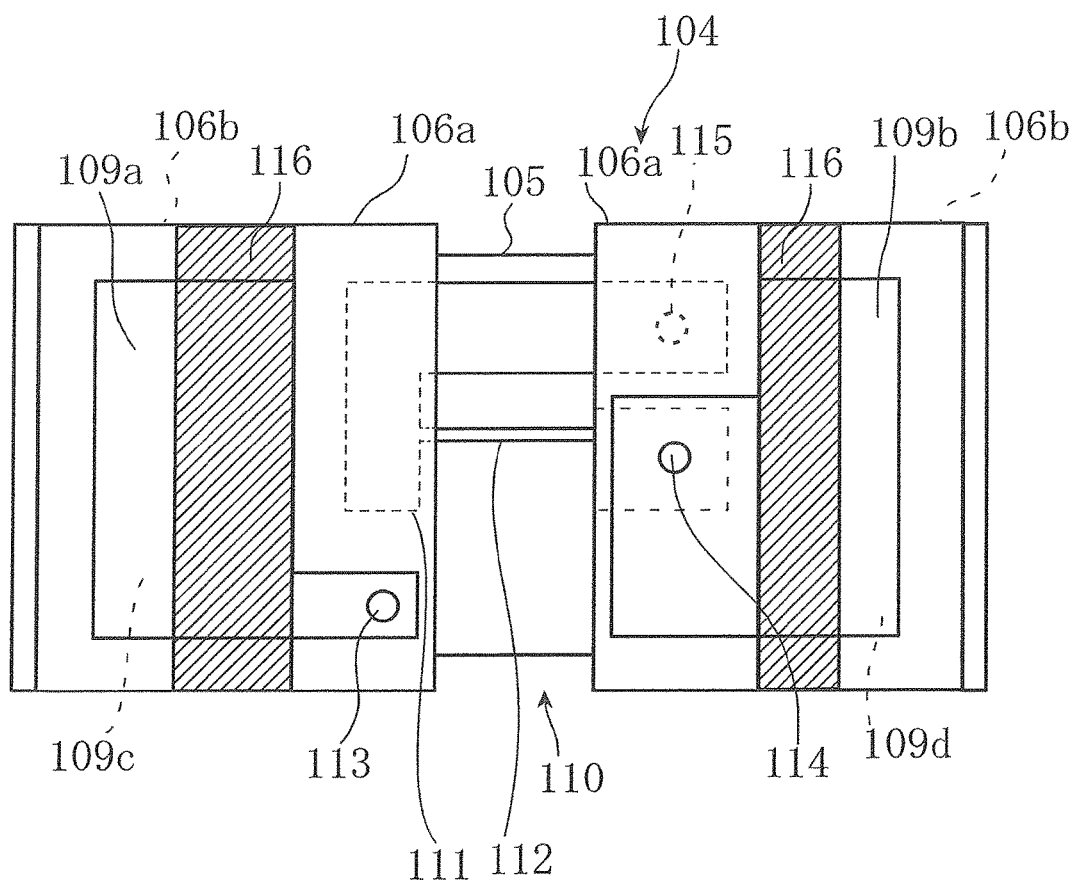
FIG. 20 is a sectional view of an X-X arrow view in FIG. 19.

Further, FIG. 18 illustrates a distribution of the crack growth rates of the samples of the sample numbers 1 to 3. A horizontal axis indicates a bonding distance B (mm) and a vertical axis indicates the crack growth rate $\chi$ (%), and ♦ marks each indicate an average value of the ten samples.

TABLE 1

| Sample No. | Conductor portion interval A (mm) | Bonding distance B (mm) | Crack growth rate $\chi$ (%) | | |
|---|---|---|---|---|---|
| | | | Maximum value | Minimum value | Average value |
| 1 | 3.5 | 3.0 | 32 | 5 | 16 |
| 2 | 3.5 | 3.6 | 44 | 6 | 26 |
| 3 | 3.5 | 4.0 | 90 | 8 | 31 |

As is clear from Table 1 and FIG. 18, the bonding distances B of the sample numbers 2 and 3 were 3.6 mm and 4.0 mm and were longer than the conductor portion interval A (=3.5 mm). Therefore, the crack growth rates $\chi$ significantly varied and the average values were increased to 26% and 31%.

By contrast with this, the bonding distance B of the sample number 1 was 3.0 mm and shorter than the conductor portion interval A. It was found that it was possible to reduce variations of the crack growth rates $\chi$ and reduce the average value to 16%.

In view of the above, it was found that the bonding distance B was preferably shorter than the conductor portion interval A from a view point of improvement of reliability.

It is possible to realize a reliable electronic device which can secure a desired fuse function of good fusing characteristics at low cost without making the electronic device larger.

What is claimed is:

1. An electronic device comprising:
    a wiring substrate;
    an electronic part electrically connected to the wiring substrate; and
    an intermediate connection layer interposed between the wiring substrate and the electronic part, the intermediate connection layer including:
      a rigid substrate;
      a flexible substrate;
      a conductive bonding agent interposed between and electrically connecting the flexible substrate and the rigid substrate;
      a plurality of first conductor portions electrically insulated from each other and positioned on a first principal surface of the flexible substrate;
      a plurality of second conductor portions electrically insulated from each other and positioned on a second principal surface of the rigid substrate, the first principal surface of the flexible substrate facing the second principal surface of the rigid substrate;
      an opening in the rigid substrate and positioned between the second conductor portions; and
      a fuse portion on the first principal surface of the flexible substrate and facing the opening.

2. The electronic device according to claim 1, wherein the electronic part is mounted on the flexible substrate, and the rigid substrate is electrically connected to the wiring substrate.

3. The electronic device according to claim 1, wherein
    the flexible substrate defines a respective through-hole inside each of the first conductor portions, and
    the conductive bonding agent is filled in the through-holes.

4. The electronic device according to claim 1, wherein the flexible substrate further defines window portions on opposed sides of the fuse portion.

5. The electronic device according to claim 1, further comprising third conductor portions on a third principal surface of the rigid substrate, the third principal surface being opposite the second principal surface, and the third conductor portions are arranged orthogonally to the second conductor portions.

6. The electronic device according to claim 1, wherein
    a pair of the first conductor portions on the first principal surface of the flexible substrate define a conductor portion interval A, and
    when the rigid substrate is bonded to the wiring substrate, a bonding distance B along a side surface direction between the rigid substrate and the wiring substrate is shorter than the conductor portion interval A.

7. The electronic device according to claim 1, wherein the flexible substrate is thinner than the rigid substrate.

8. The electronic device according to claim 1, further comprising a metal film on a side surface of the intermediate connection layer.

9. The electronic device according to claim 1, wherein the flexible substrate is mainly made of a heat resistance resin material.

10. The electronic device according to claim 1, wherein the conductive bonding agent is a solder material.

11. An intermediate connection layer for an electronic device, the intermediate connection layer comprising:
    a rigid substrate;
    a flexible substrate;
    a conductive bonding agent interposed between and electrically connecting the flexible substrate and the rigid substrate;
    a plurality of first conductor portions electrically insulated from each other and positioned on a first principal surface of the flexible substrate;
    a plurality of second conductor portions electrically insulated from each other and positioned on a second principal surface of the rigid substrate, the first principal surface of the flexible substrate facing the second principal surface of the rigid substrate;
    an opening in the rigid substrate and positioned between the second conductor portions; and
    a fuse portion on the first principal surface of the flexible substrate and facing the opening.

12. The intermediate connection layer for an electronic device according to claim 11, wherein the flexible substrate defines a respective through-hole inside each of the first conductor portions, and the conductive bonding agent is filled in the through-holes.

13. The intermediate connection layer for an electronic device according to claim 11, wherein the flexible substrate further defines window portions on opposed sides of the fuse portion.

14. The intermediate connection layer for an electronic device according to claim 11, further comprising third conductor portions on a third principal surface of the rigid substrate, the third principal surface being opposite the second principal surface, and the third conductor portions are arranged orthogonally to the second conductor portions.

15. A method for manufacturing intermediate connection layer for an electronic device, the method comprising:

preparing a rigid mother board and a flexible mother board;

forming a plurality of first conductor portions which are electrically insulated from each other on a first principal surface of the flexible mother board;

forming a fuse portion on the first principal surface of the flexible substrate;

forming through-holes inside the first conductor portions;

forming a plurality of second conductor portions which is electrically insulated from each other on a second principal surface of the rigid mother board;

forming an opening between the plurality of second conductor portions;

applying a conductive bonding agent on the rigid substrate; and arranging the flexible substrate and the rigid substrate relative to each other such that the fuse portion faces the opening; and filling the conductive bonding agent in the through-holes such that the flexible substrate and the rigid substrate are bonded to each other with the conductive bonding agent interposed therebetween.

16. The method for manufacturing the intermediate connection layer for the electronic device according to claim 15, further comprising:

mounting an electronic part on the flexible substrate; and electrically connecting the rigid substrate to a wiring substrate.

17. The method for manufacturing the intermediate connection layer for the electronic device according to claim 15, further comprising forming window portions along opposed sides of the fuse portion.

18. The method for manufacturing the intermediate connection layer for the electronic device according to claim 15, wherein the conductive bonding agent is applied to the rigid substrate by a printing method.

19. The method for manufacturing the intermediate connection layer for the electronic device according to claim 15, further comprising forming a metal film on a side surface of the rigid mother board.

20. The method for manufacturing the intermediate connection layer for the electronic device according to claim 15, wherein the conductive bonding agent is a solder material.

* * * * *